(12) United States Patent
Adkisson et al.

(10) Patent No.: US 7,620,931 B2
(45) Date of Patent: Nov. 17, 2009

(54) METHOD OF ADDING FABRICATION MONITORS TO INTEGRATED CIRCUIT CHIPS

(75) Inventors: James W. Adkisson, Jericho, VT (US); Greg Bazan, Essex Junction, VT (US); John M. Cohn, Richmond, VT (US); Matthew S. Grady, Burlington, VT (US); Thomas G. Sopchak, Williston, VT (US); David P. Vallett, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 11/859,890

(22) Filed: Sep. 24, 2007

(65) Prior Publication Data

US 2008/0017857 A1    Jan. 24, 2008

Related U.S. Application Data

(62) Division of application No. 11/687,731, filed on Mar. 19, 2007, now Pat. No. 7,323,278, which is a division of application No. 10/907,494, filed on Apr. 4, 2005, now Pat. No. 7,240,322.

(51) Int. Cl.
*G06F 17/50* (2006.01)

(52) U.S. Cl. .............................. 716/21; 716/19; 716/20; 257/48; 324/754; 430/30

(58) Field of Classification Search ............. 716/19–21; 257/48; 324/754; 430/30
See application file for complete search history.

(56) References Cited

U.S. PATENT DOCUMENTS

| | | | |
|---|---|---|---|
| 4,801,869 A * | 1/1989 | Sprogis ...................... 714/733 |
| 5,159,752 A | 11/1992 | Mahant-Shetti et al. |
| 5,723,874 A * | 3/1998 | Baker et al. .................... 257/48 |
| 5,781,445 A | 7/1998 | Shiue et al. |
| 5,900,644 A | 5/1999 | Ying et al. |
| 5,952,674 A * | 9/1999 | Edelstein et al. ............... 257/48 |
| 5,959,459 A * | 9/1999 | Satya et al. .................. 324/751 |
| 5,962,867 A | 10/1999 | Liu |
| 6,030,732 A | 2/2000 | Liu |
| 6,121,156 A * | 9/2000 | Shamble et al. .............. 438/734 |
| 6,147,361 A | 11/2000 | Lin et al. |
| 6,362,634 B1 * | 3/2002 | Jarvis et al. .................. 324/719 |
| 6,433,561 B1 * | 8/2002 | Satya et al. .................. 324/753 |
| 6,509,197 B1 * | 1/2003 | Satya et al. .................... 438/12 |
| 6,576,923 B2 * | 6/2003 | Satya et al. .................... 257/48 |

(Continued)

*Primary Examiner*—Naum B Levin
(74) *Attorney, Agent, or Firm*—Schmeiser, Olsen & Watts; Richard M. Kotulak

(57) ABSTRACT

An integrated circuit, a method and a system for designing and a method fabricating the integrated circuit. The method including: (a) generating a photomask level design of an integrated circuit design of the integrated circuit, the photomask level design comprising a multiplicity of integrated circuit element shapes; (b) designating regions of the photomask level design between adjacent integrated circuit element shapes, the designated regions large enough to require placement of fill shapes between the adjacent integrated circuit elements based on fill shape rules, the fill shapes not required for the operation of the integrated circuit; and (c) placing one or more monitor structure shapes of a monitor structure in at least one of the designated regions, the monitor structure not required for the operation of the integrated circuit.

17 Claims, 12 Drawing Sheets

U.S. PATENT DOCUMENTS

| | | | |
|---|---|---|---|
| 6,623,995 B1 * | 9/2003 | Chen et al. | 438/14 |
| 6,624,031 B2 * | 9/2003 | Abadeer et al. | 438/268 |
| 6,771,806 B1 * | 8/2004 | Satya et al. | 382/149 |
| 6,787,271 B2 * | 9/2004 | Cote et al. | 430/5 |
| 6,823,496 B2 * | 11/2004 | Bergman Reuter et al. | 716/4 |
| 6,834,117 B1 * | 12/2004 | Rao et al. | 382/149 |
| 6,936,920 B2 * | 8/2005 | Whitefield | 257/724 |
| 6,998,866 B1 * | 2/2006 | Bazan et al. | 324/765 |
| 7,089,522 B2 * | 8/2006 | Tan et al. | 716/11 |
| 7,093,213 B2 * | 8/2006 | Cohn et al. | 716/4 |
| 7,323,278 B2 * | 1/2008 | Adkisson et al. | 430/30 |
| 2002/0045337 A1 * | 4/2002 | Nam et al. | 438/631 |
| 2004/0232910 A1 * | 11/2004 | Ciplickas et al. | 324/230 |
| 2005/0010890 A1 * | 1/2005 | Nehmadi et al. | 716/19 |
| 2005/0086617 A1 * | 4/2005 | Ciplickas et al. | 716/4 |
| 2006/0019424 A1 * | 1/2006 | Weng et al. | 438/60 |
| 2006/0026472 A1 * | 2/2006 | Adkisson et al. | 714/726 |

* cited by examiner

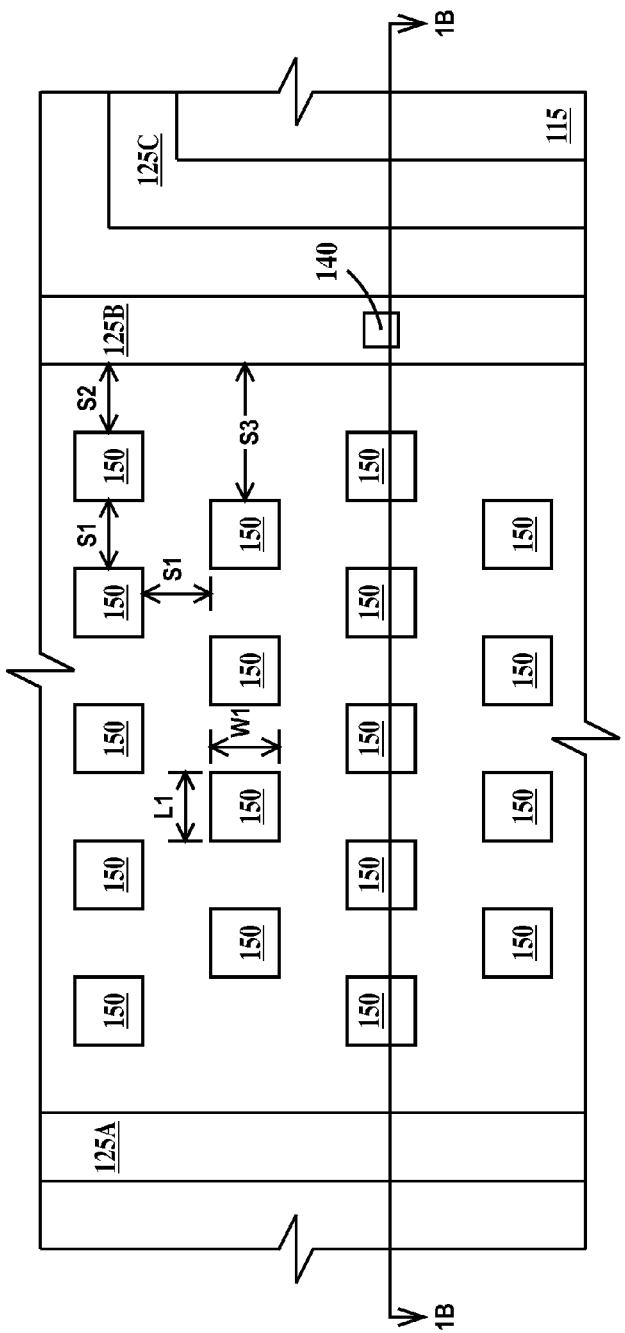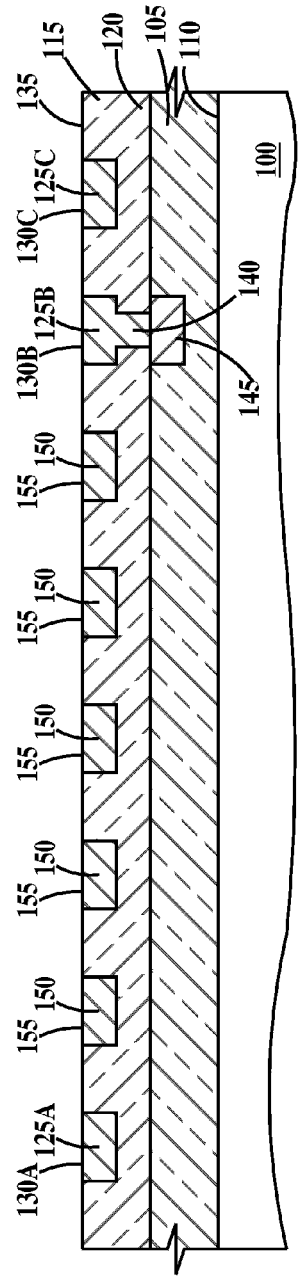
FIG. 1A
FIG. 1B

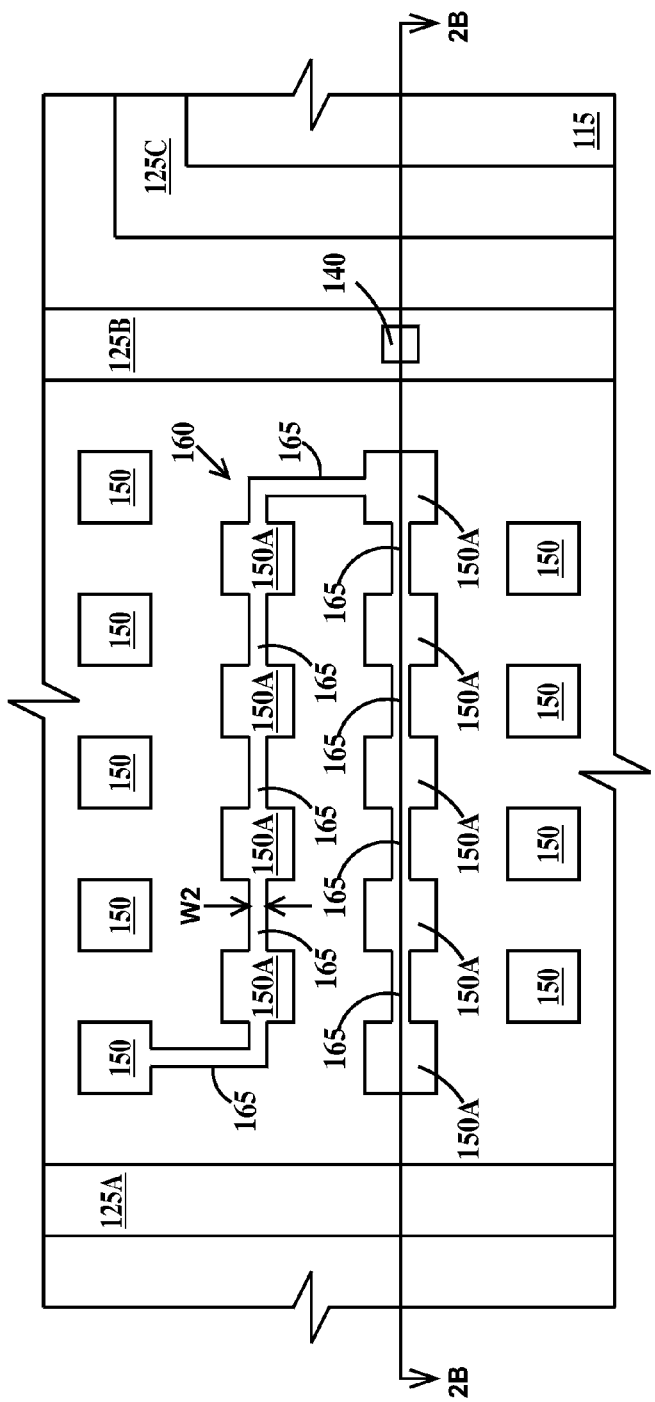
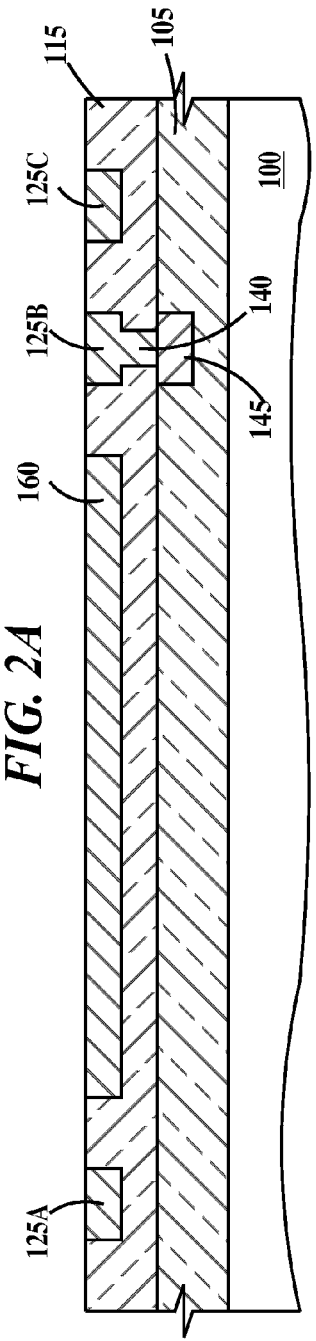
FIG. 2A
FIG. 2B

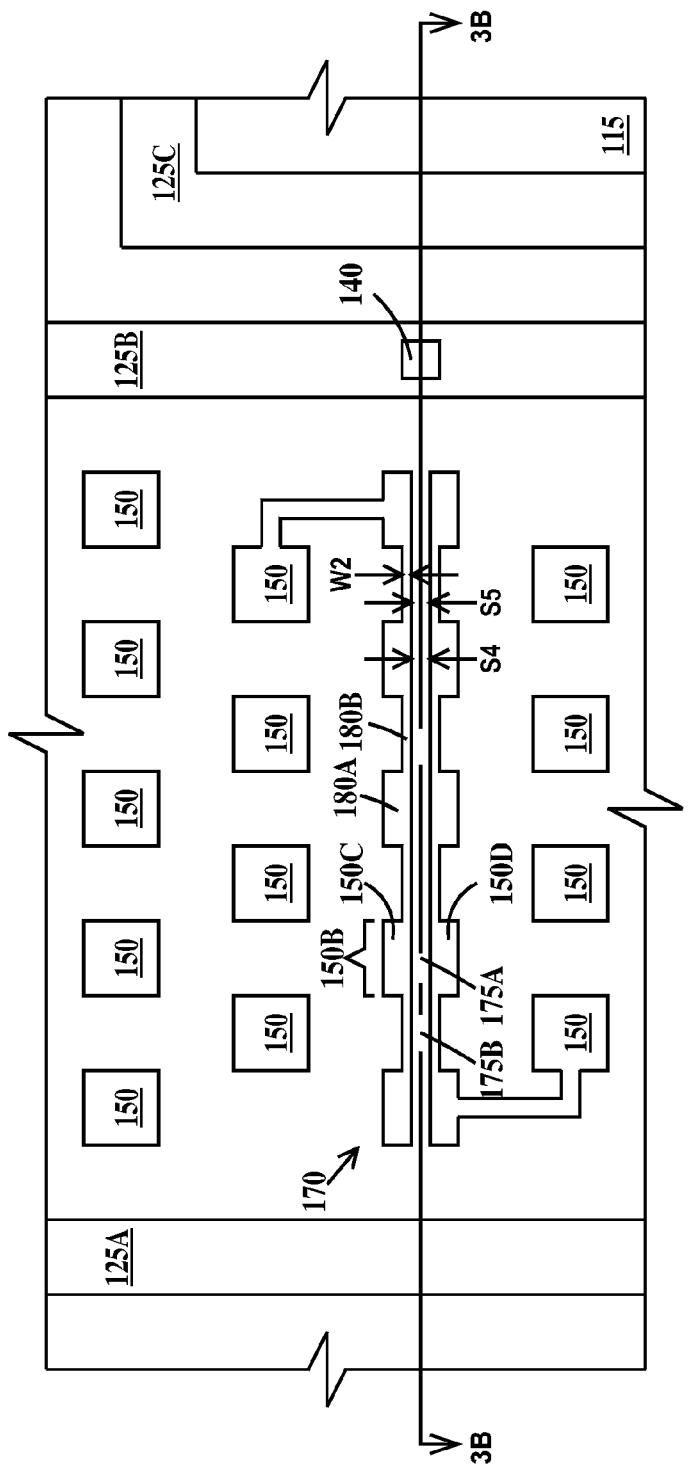
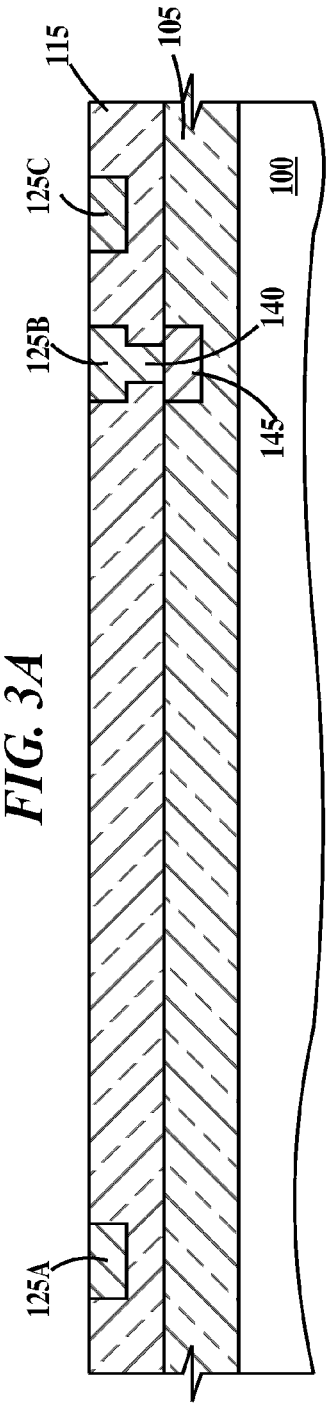
FIG. 3A
FIG. 3B

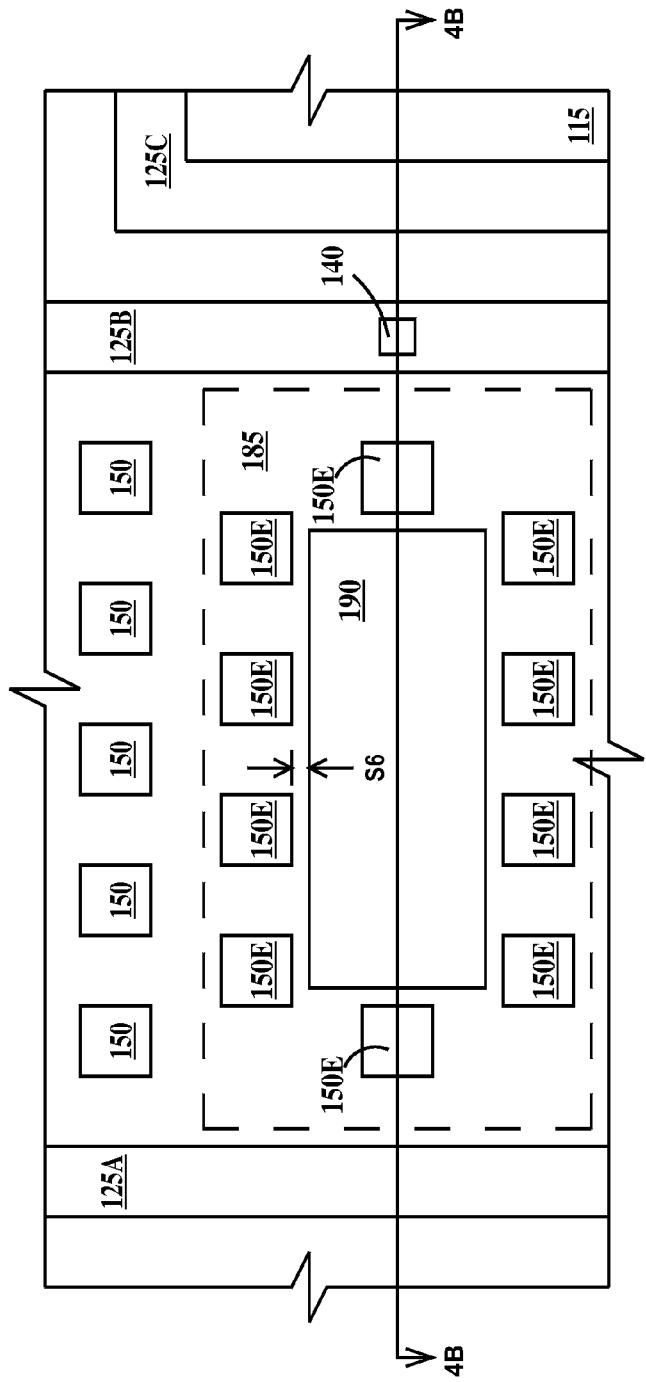
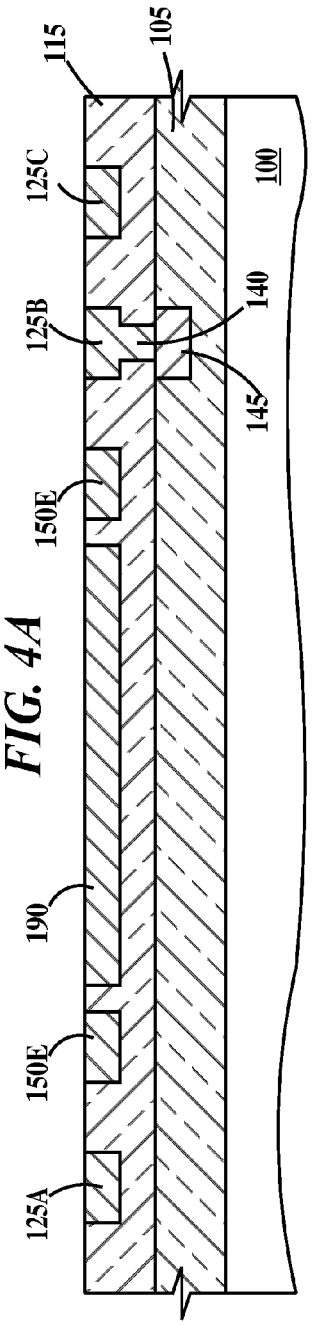
FIG. 4A
FIG. 4B

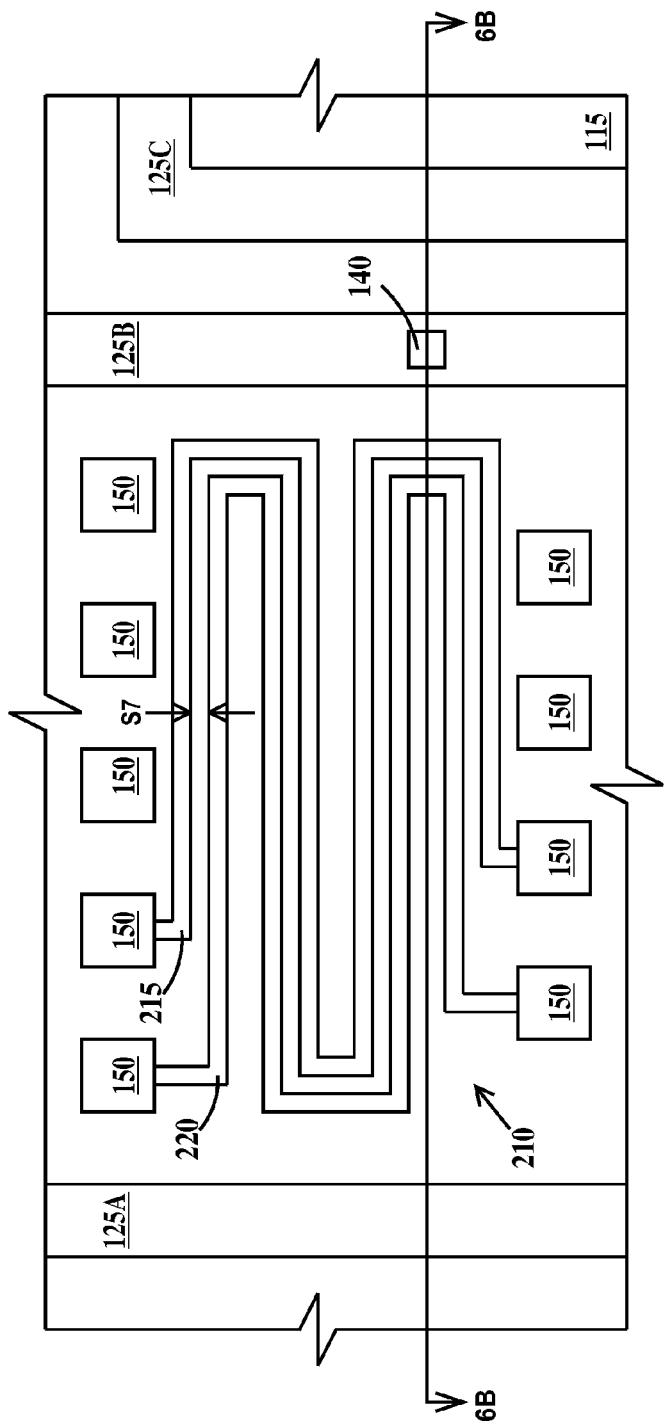
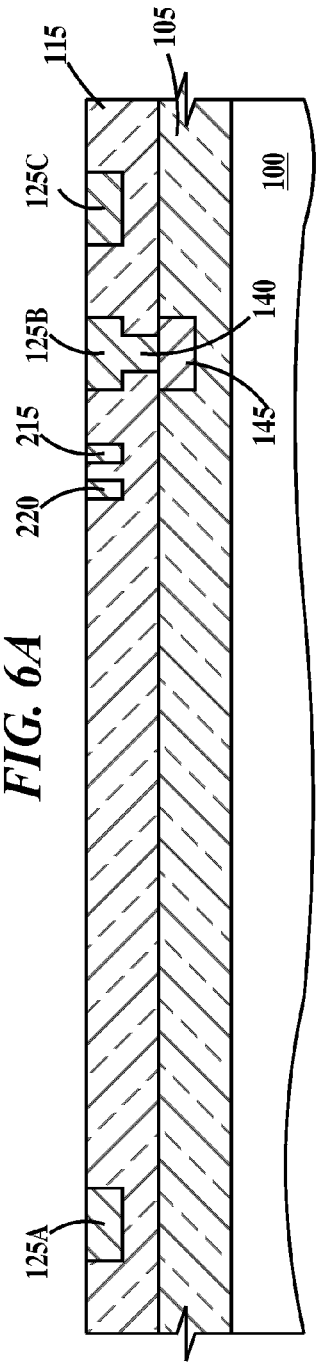
FIG. 6A
FIG. 6B

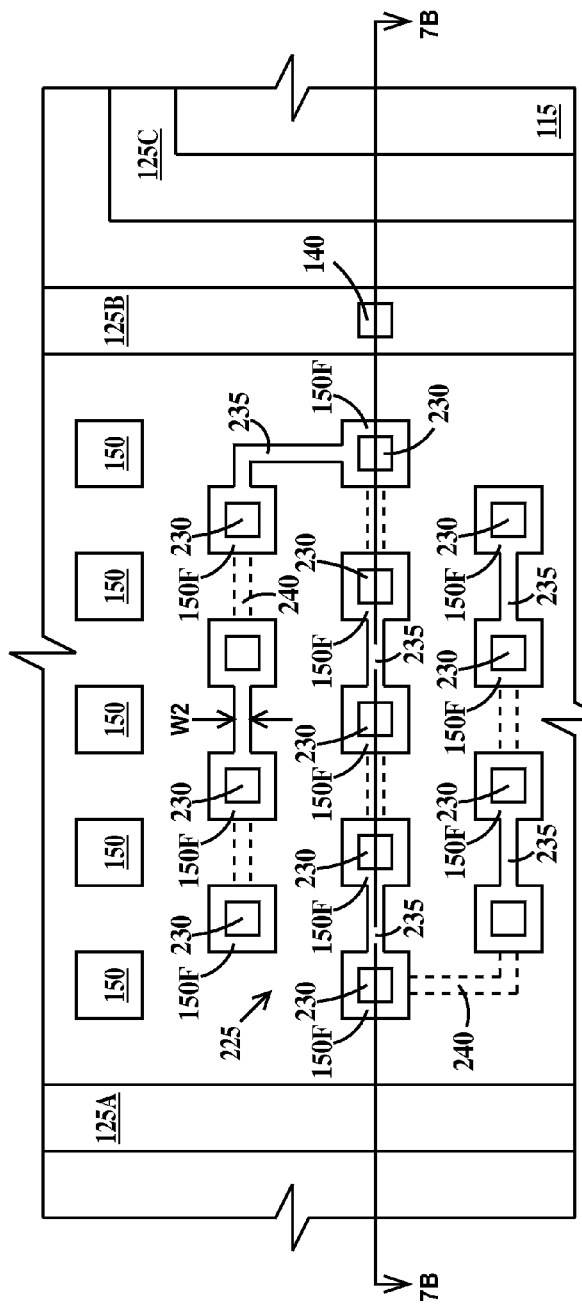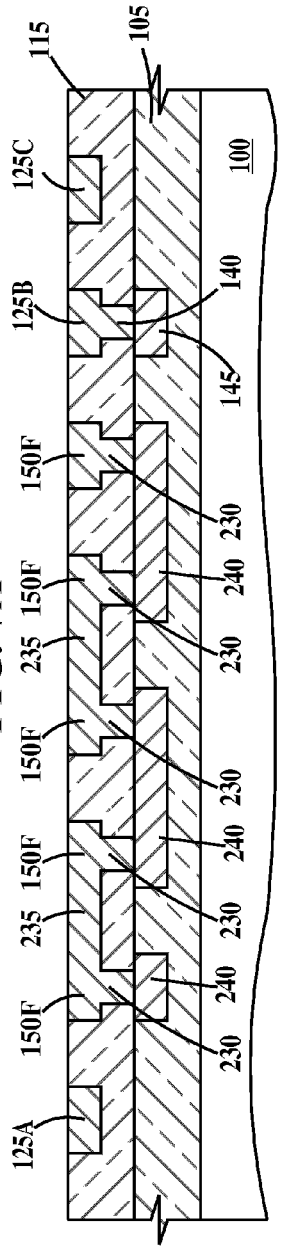
FIG. 7A
FIG. 7B

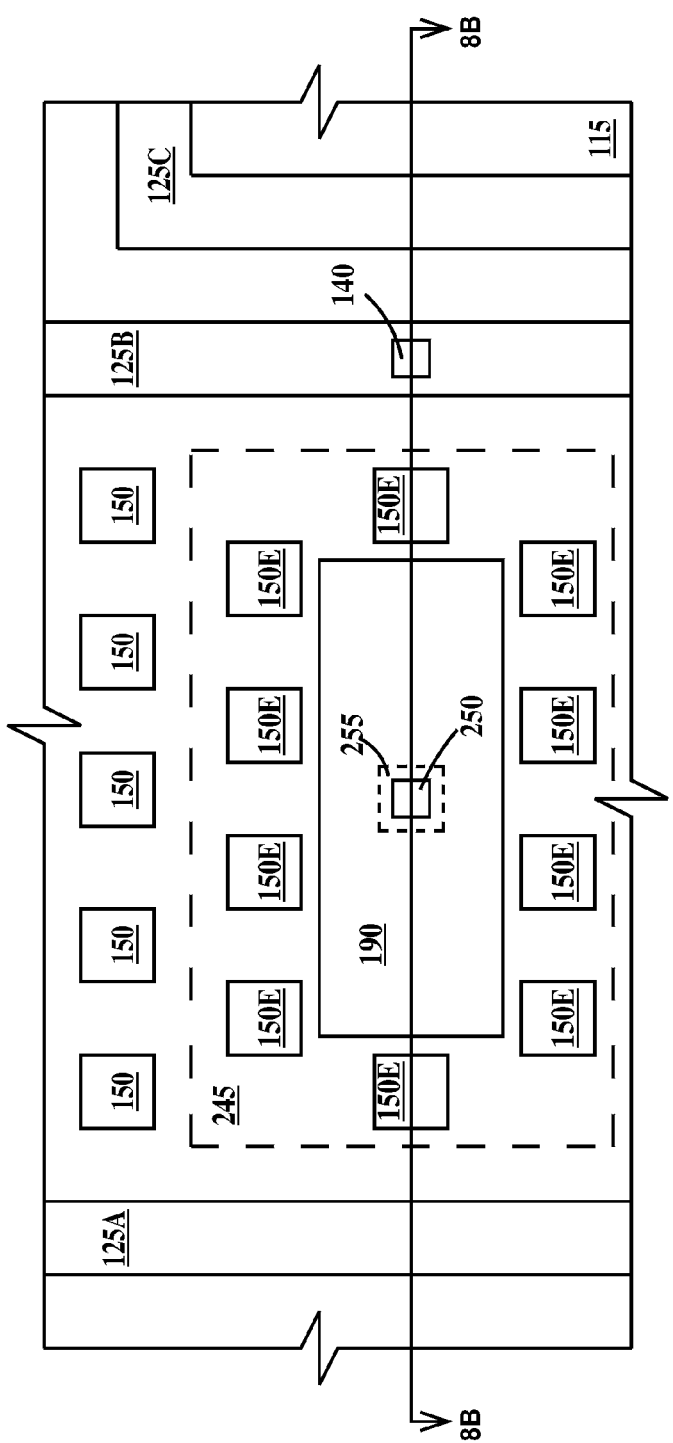
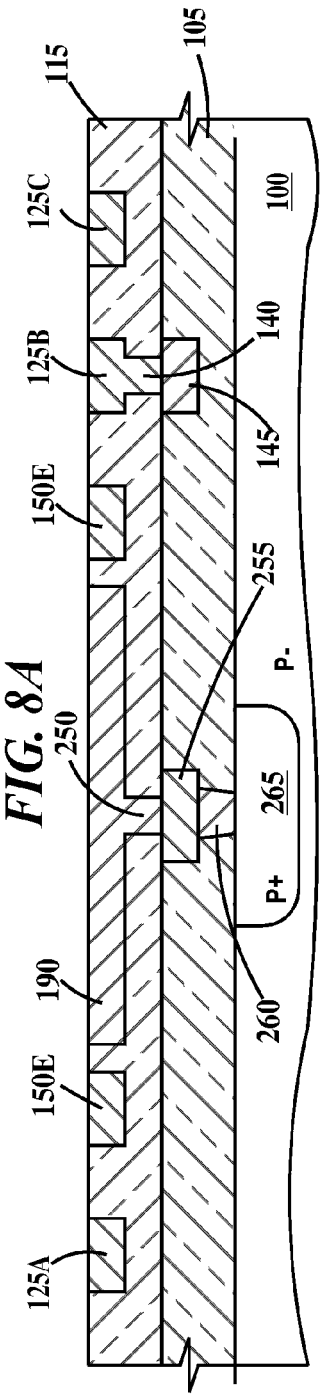
FIG. 8A
FIG. 8B

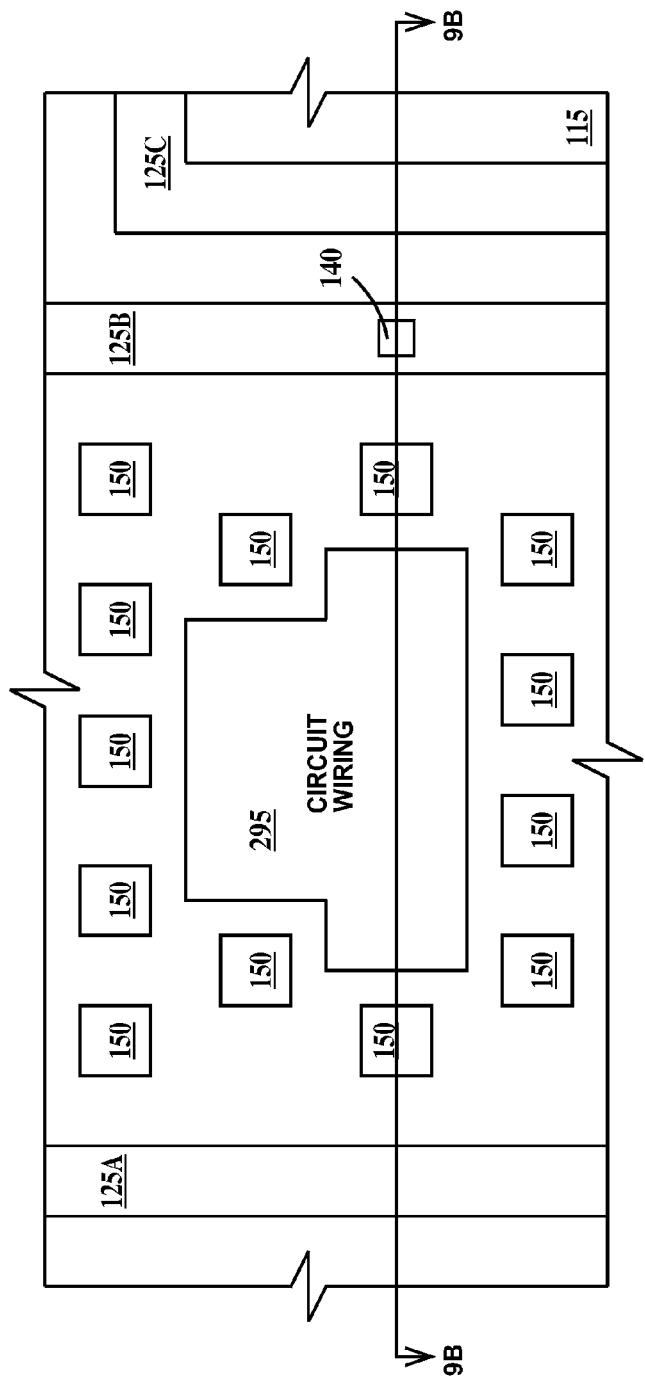
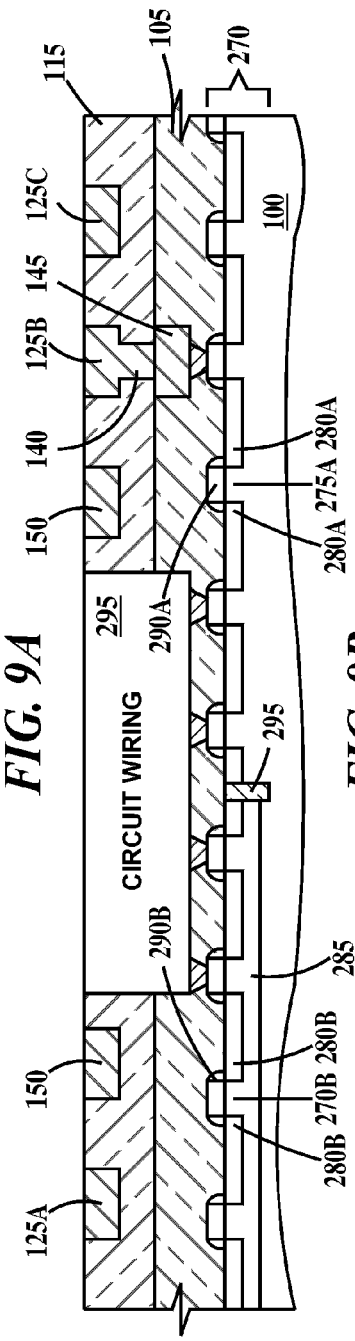
FIG. 9A
FIG. 9B

US 7,620,931 B2

METHOD OF ADDING FABRICATION MONITORS TO INTEGRATED CIRCUIT CHIPS

RELATED APPLICATIONS

This Application is a division of U.S. patent application Ser. No. 11/687,731 filed on Mar. 19, 2007, now U.S. Pat. No. 7,323,278 which is a division of US. patent Ser. No. 10/907,494 now U.S. Pat. No. 7,240,322 filed on Apr. 4, 2005.

FIELD OF THE INVENTION

The present invention relates to the field of integrated circuit design and fabrication; more specifically, it relates to method for adding defect monitor devices to integrated circuit chips.

BACKGROUND OF THE INVENTION

In order to fabricate advanced integrated circuits cost-effectively, manufacturing defect densities need to be driven as low as possible and device and process controls need to be adjusted to drive device and circuit parametrics and performances to within specified ranges. One method of doing so is to place defect and performance monitor structures, as well as test circuits in the scribe line. A scribe line is an area between integrated circuits fabricated in arrays on wafers where dicing will occur. The scribe line contains no circuit elements required for the normal functioning of the integrated circuit. Scribe lines are also known as streets or kerfs. Scribe lines are where the cuts to separate a wafer (which contains many chips) into individual chips are made. However, not only do the monitor structures that are most desirable consume large areas of the scribe line, but additionally the area of the scribe line is limited and continues to shrink as productivity demands increase, with the result being that all desirable monitors will not fit in the available scribe line area.

Therefore, there is a continuing need for placing more monitor structures on integrated circuits than is currently possible.

SUMMARY OF THE INVENTION

The present invention uses the regions of individual photomask levels of integrated circuits normally containing damascene fill shapes for placement of damascene monitor or the damascene portions of monitor structures by either utilizing the damascene fill shapes to form monitor structures, by placing monitors in areas designated for fill shapes or by replacing damascene fill shapes with monitor structures. Monitor structures may include structures other than damascene structures, i.e. transistors to which damascene monitor structures are connected.

A first aspect of the present invention is a method of designing an integrated circuit, comprising: (a) generating a photomask level design of an integrated circuit design of the integrated circuit, the photomask level design comprising a multiplicity of integrated circuit element shapes; (b) designating regions of the photomask level design between adjacent integrated circuit element shapes, the designated regions large enough to require placement of fill shapes between the adjacent integrated circuit elements based on fill shape rules, the fill shapes not required for the operation of the integrated circuit; and (c) placing one or more monitor structure shapes of a monitor structure in at least one of the designated regions, the monitor structure not required for the operation of the integrated circuit.

A second aspect of the present invention is a method of fabricating an integrated circuit, comprising: (a) generating a photomask level design of an integrated circuit design of the integrated circuit, the photomask level design comprising a multiplicity of integrated circuit element shapes; (b) designating regions of the photomask level design between adjacent integrated circuit element shapes, the designated regions large enough to require placement of fill shapes between the adjacent integrated circuit elements based on fill shape rules, the fill shapes not required for the operation of the integrated circuit; (c) placing one or more monitor structure shapes of a monitor structure in at least one of the designated regions, the monitor structure not required for the operation of the integrated circuit; (d) placing fill shapes in the designated regions of the photomask design level, the fill shapes not connected to the multiplicity of integrated circuit element shapes or to the one or more monitor structure shapes; (e) generating a mask data set from the photomask level design; and (f) using the mask data set to form a pattern on a wafer in order to fabricate a physical level of the integrated circuit.

A third aspect of the present invention is an integrated circuit chip, comprising: a dielectric layer on a substrate, the dielectric layer having a circuit region containing integrated circuits required for operation of the integrated circuit chip and a surrounding scribe line region not containing integrated circuits required for operation of the integrated circuit chip; a multiplicity of wires of an integrated circuit, the wires formed in the circuit region of the dielectric layer; and a monitor structure and a multiplicity of fill shapes in regions of the dielectric layer between the wires, the monitor structure and the fill shapes not required for the operation of the integrated circuit, the monitor structure not connected to the wires, the fill shapes not connected to the wires and the monitor structure not connected to the fill shapes.

A fourth aspect of the present invention is a computer system comprising a processor, an address/data bus coupled to the processor, and a computer-readable memory unit coupled to communicate with the processor, the memory unit containing instructions that when executed implement a method for designing an integrated circuit the method comprising the computer implemented steps of: (a) generating a photomask level design of an integrated circuit design of the integrated circuit, the photomask level design comprising a multiplicity of integrated circuit element shapes; (b) designating regions of the photomask level design between adjacent integrated circuit element shapes, the designated regions large enough to require placement of fill shapes between the adjacent integrated circuit elements based on fill shape rules, the fill shapes not required for the operation of the integrated circuit; and (c) placing one or more monitor structure shapes of a monitor structure in at least one of the designated regions, the monitor structure not required for the operation of the integrated circuit.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 1A is a top view and FIG. 1B is a cross-sectional view through line 1B-1B of FIG. 1A of a portion of an integrated circuit chip having fill shapes that may be manipulated according to the present invention;

FIG. 2A is a top view and FIG. 2B is a cross-sectional view through line 2B-2B of FIG. 2A of a portion of an integrated circuit chip having fill shapes illustrating a first implementation example of the present invention;

FIG. 3A is a top view and FIG. 3B is a cross-sectional view through line 3B-3B of FIG. 3A of a portion of an integrated circuit chip having fill shapes illustrating a second implementation example of the present invention;

FIG. 4A is a top view and FIG. 4B is a cross-sectional view through line 4B-4B of FIG. 4A of a portion of an integrated circuit chip having fill shapes illustrating a third implementation example of the present invention;

FIG. 6A is a top view and FIG. 6B is a cross-sectional view through line 6B-6B of FIG. 6A of a portion of an integrated circuit chip having fill shapes illustrating a fifth implementation example of the present invention;

FIG. 7A is a top view and FIG. 7B is a cross-sectional view through line 7B-7B of FIG. 7A of a portion of an integrated circuit chip having fill shapes illustrating a sixth implementation example of the present invention;

FIG. 8A is a top view and FIG. 8B is a cross-sectional view through line 8B-8B of FIG. 8A of a portion of an integrated circuit chip having fill shapes illustrating a seventh implementation example of the present invention;

FIG. 9A is a top view and FIG. 9B is a cross-sectional view through line 9B-9B of FIG. 9A of a portion of an integrated circuit chip having fill shapes illustrating an eighth second implementation example of the present invention;

DETAILED DESCRIPTION OF THE INVENTION

Figures 5A, 5B:
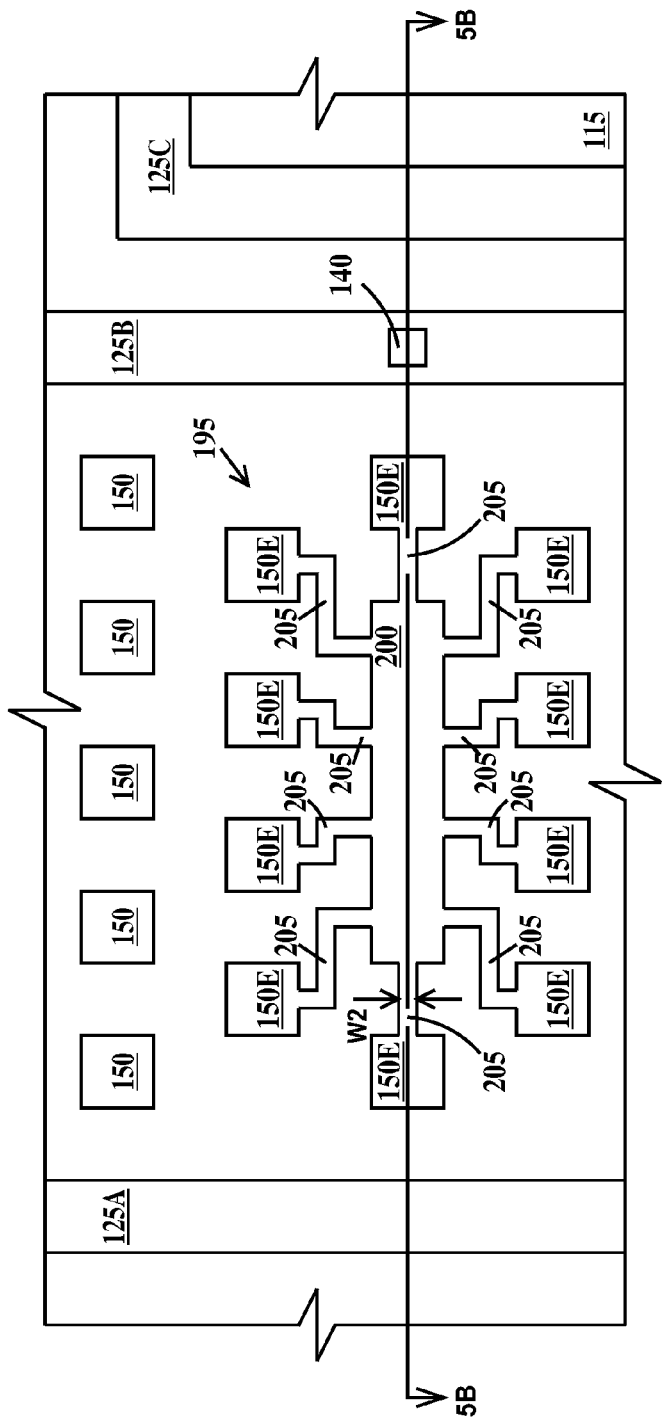
FIG. 5A is a top view and FIG. 5B is a cross-sectional view through line 5B-5B of FIG. 5A of a portion of an integrated circuit chip having fill shapes illustrating a fourth implementation example of the present invention.

Fabrication of integrated circuit chips often requires one or more chemical-mechanical-polish (CMP) processes. A CMP process subjects a surface of a wafer on which integrated circuits are being fabricated to a combination of mechanical abrasion and chemical dissolution to remove materials from the surface of the wafer and generate a planar surface. Two examples of processes that use a CMP process will be given.

A first example of a fabrication step that uses CMP is the formation of damascene wires. To form damascene wires, a dielectric layer is deposited on the surface of the wafer, trenches having the pattern of the wires are etched into the dielectric layer, a blanket deposition of conductor is deposited (for example, a metal) to overfill the trenches, and then the CMP is performed to remove excess conductor from the surface between the trenches and to cause the surface of the dielectric layer to be co-planar with the surface of the conductor. In a first example, the pattern is created by exposing a layer of photoresist formed on the dielectric layer to light through a photomask having a physical positive or negative image of the trench pattern, developing the photoresist image and etching the direct through opening in the photoresist layer. The photomask in turn was fabricated from a photomask level design dataset containing mathematical representations (shapes) of the pattern on the photomask. In a second example, the photomask level design dataset may be used to directly form the pattern in the photoresist layer. This second example is called direct write.

A second example of a fabrication step that uses CMP is the formation of planar dielectric layers in which wires and other structures have been formed by a subtractive etch process, hereinafter subtractive wires and subtractive structures. In one method, form a subtractive wire, a blanket layer of a conductor (for example aluminum or aluminum alloy) is formed on a dielectric layer, a photoresist layer is formed on the conductor layer, the photoresist layer is patterned into wire shapes by a photolithographic process, conductor layer not protected the photoresist pattern is etched away ("subtracted") and the patterned photoresist layer removed. Next a second blanket dielectric layer is formed of a thickness greater than the thickness of the original metal layer, which fills in the spaces between the wires and covers the wires. Finally a CMP process is performed to remove the dielectric layer from over the wires and make the top surfaces of the remaining dielectric layer and wires coplanar. The process may be repeated to for alternating layers of wires and vias connecting wire is different dielectric layers.

However, with either a damascene or subtractive process the uniformity of material (dielectric and/or metal) removal is a function (among other factors) of the ratio of conductor area (in the trenches or width of subtractive wires) to dielectric area (between the trenches or between subtractive wires). Often large areas of the wafer surface are empty of wires (in one example, between about 10% and about 70% of each chip area contains no wires) and often the ratio of conductor area to dielectric area varies greatly in different areas of a given fabrication level of the integrated circuit chip. To make the ratio of conductor area to dielectric area more uniform across an integrated circuit chip fabrication level and thus increase the uniformity of the CMP process, damascene or subtractive fill shapes are introduced into the spaces between conductors according to complex fill shape rules, some of which are discussed infra.

The present invention will be described using damascene structures (wires, vias, fill shapes and monitor structures as described infra) but it should be understood that the present invention is applicable to subtractive structures (wires, vias, fill shapes and monitor structures) as well. Further, the present invention is applicable to structures wherein the wires are formed by methods other than damascene and subtractive processes but that require a CMP step of a dielectric layer in contact with the wires as part of the structures fabrication process.

For the purposes of the present invention, the term damascene shape will be used to refer to a physical entity of an integrated circuit chip, while the term shape will be used to refer to a mask image or mathematical representation of a mask image in a photomask dataset.

For the purposes of the present invention, the following properties of damascene fill shapes apply. Damascene fill shapes are formed identically and simultaneously with damascene integrated circuit element shapes in specially laid out and isolated trenches (or holes) etched into a supporting layer. Damascene fill shapes are formed from the same material as the damascene integrated circuit element shapes. Damascene fill shapes are not connected to each other or to damascene integrated circuit element shapes (i.e. damascene wires or vias) in their own fabrication level or to other damascene fill shapes and damascene integrated circuit element shapes in any other fabrication level. Damascene integrated circuit element shapes are required for the functioning of the integrated circuit(s) of the integrated circuit chip, damascene fill shapes are not part of the integrated circuit(s) of the integrated circuit chip. A common use of damascene fill shapes is in the wiring levels of integrated circuits where the damascene integrated circuit element shapes are wires, wire segments and vias between wires and wire segments in immediately adjacent wiring levels and the supporting layer is a dielectric layer.

FIG. 1A is a top view and FIG. 1B is a cross-sectional view through line 1B-1B of FIG. 1A of a portion of an integrated circuit chip having damascene fill shapes that may be manipulated according to the present invention. In FIGS. 1A and 1B, a semiconductor substrate 100 (see FIG. 1B) has a first dielectric layer 105 formed on a top surface of the substrate and a second dielectric layer 115 formed on a top surface 120 of the first dielectric layer. Damascene wires 125A, 125B and 125C are formed in second dielectric layer 115. Top surfaces 130A, 130B and 130C of respective damascene wires 125A, 125B and 125C are coplanar with one another and a top surface 135 of second dielectric layer 115. A damascene via 140 connects wire 125B to a damascene wire 145 formed in first dielectric layer 105. A multiplicity of damascened damascene fill shapes 150 are formed in second dielectric layer 115 between damascene wire 125A and damascene wire 125B. Top surfaces 155 of damascene fill shapes 150 are coplanar with top surface 135 of second dielectric layer 115. The width W1, length L1 and space S1 between adjacent damascene fill shapes 150 are determined by fill shape rules for the mask level associated with second dielectric layer 115. The minimum space S2 and maximum space S3 between a damascene fill shape and a damascene wire is also included in the fill shape rules. Length L1, width W1 and spaces S1, S2 and S3 are chosen to be easily printable during the photolithographic steps used in the fabrication of damascene fill shapes 150 and are larger than a minimum ground rule (i.e., minimum image size printable by the photolithographic step plus any etch bias associated with the trench formation step). The value of the minimum ground rule for line spacing may be different than the value of the minimum ground rule for line widths Substrate 100 may contain active devices, such field effect transistor (FETs) and diodes, and may contain passive devices such as resistors and capacitors that are wired into circuits using wires, such as wires 125A, 125B, 125C and 145, and vias 140 in first and second dielectric layers 105 and 115 as well as contacts (not shown) connecting devices (not shown) in the substrate and wires (such as damascene wire 145) in first dielectric layer 105.

In FIG. 1B, damascene wire 145 was defined in extent and location by a first photomask level design dataset containing mathematical representations of wire shapes used to generate a first photomask. Damascene via 140 was defined by a second photomask level design dataset containing mathematical representations of via shapes used to generate a second photomask. Damascene wires 125A, 125B, 125C and damascene fill shapes 150 were defined by a third photomask level design dataset containing mathematical representations of wire shapes and fill shapes used to generate a third photomask.

FIG. 2A is a top view and FIG. 2B is a cross-sectional view through line 2B-2B of FIG. 2A of a portion of an integrated circuit chip having damascene fill shapes illustrating a first implementation example of the present invention. In FIGS. 2A and 2B, an electrically probeable opens monitor 160 replaces a subset of damascene fill shapes 150 of FIGS. 1A and 1B. In the example of FIGS. 2A and 2B, opens monitor 160 comprises damascene fill shaped regions 150A integrally connected in series by damascene wires 165. Filled shaped damascene regions 150A are not damascene fill shapes but have an identical or similar geometry to that of damascene fill shapes. In one example, damascene fill shape regions 150A are placed in the same locations and have the same dimensions as the damascene fill shapes that they replace and damascene wires 165 have a width W2. In a first example, W2 is less than W1 but equal to or greater than the minimum ground rule value. In a second example, W2 is less than W1 and less than the minimum ground rule value. (There are many methods known in the art to generate sub-minimum images.) Thus, opens monitor 160 has about the same damascene shapes density as areas containing only damascene fill shapes, especially when damascene wires 165 are fabricated to minimum ground rules.

FIG. 3A is a top view and FIG. 3B is a cross-sectional view through line 3B-3B of FIG. 3A of a portion of an integrated circuit chip having damascene fill shapes illustrating a second implementation example of the present invention. In FIGS. 3A and 3B, an electrically probeable shorts monitor 170 replaces a subset of damascene fill shapes 150 of FIGS. 1A and 1B. In the example of FIGS. 3A and 3B, shorts monitor 170 comprises damascene fill shaped regions 150B comprising two half regions 150C and 150D separated by a space 175A. Space 175A has a width S4. Half regions 150C are integrally connected in series by wires 180A and half regions 150D are integrally connected in series by damascene wires 180B. Damascene wires 180A and 180B are separated by a space 175B having a width S5. In one example, damascene fill shaped regions 150B are placed in the same locations and have the same dimensions as the damascene fill shapes that they replace and damascene wires 180A and 180B have the width W2. In a first example, S4, S5 or both S4 and S5 are equal to or greater than the minimum ground rule value. In a second example, S4 or S5 or both S4 and S5 are less than the minimum ground rule value. In either the first or second examples, S4 may equal S5. Thus, shorts monitor 170 has about the same shapes density as areas containing only damascene fill shapes, especially when spaces 175A and 175B and damascene wires 180A and 180B are fabricated to minimum ground rules.

FIG. 4A is a top view and FIG. 4B is a cross-sectional view through line 4B-4B of FIG. 4A of a portion of an integrated circuit chip having damascene fill shapes illustrating a third implementation example of the present invention. In FIGS. 4A and 4B, a voltage contrast shorts monitor 185 replaces a subset of damascene fill shapes 150 of FIGS. 1A and 1B. Shorts monitor 185 includes a damascene central pad 190 which may be grounded by a probe and a multiplicity of surrounding damascene outer pads 150E spaced a distance S6 from damascene central pad 190. In one example, damascene outer pads 150E are placed in the same locations and have the same dimensions as the damascene fill shapes that they replace. In a first example, S6 is equal to or greater than the minimum ground rule value. In a second example, S6 is less than the minimum ground rule value. In actually generating a photomask data set according to the present invention, fill shapes are removed and may be replaced with some monitor shapes that are identical to and identically located relative to the fill shapes they replace.

Voltage contrast measurements are described in detail in U.S. Pat. No. 5,159,752 to Mahant-Shetti et al., which is hereby incorporated by reference in its entirety.

FIG. 5A is a top view and FIG. 5B is a cross-sectional view through line 5B-5B of FIG. 5A of a portion of an integrated circuit chip having damascene fill shapes illustrating a fourth implementation example of the present invention. In FIGS. 5A and 5B, a voltage contrast opens monitor 195 replaces a subset of damascene fill shapes 150 of FIGS. 1A and 1B. Opens monitor 195 includes a damascene central pad 200 which may be grounded by a probe and a multiplicity of surrounding damascene outer pads 150E connected to damascene central pad 200 by damascene wires 205. In one example, damascene outer pads 150E are placed in the same locations and have the same dimensions as the damascene fill shapes that they replace. Damascene wires 205 have the width W2.

FIG. 6A is a top view and FIG. 6B is a cross-sectional view through line 6B-6B of FIG. 6A of a portion of an integrated circuit chip having damascene fill shapes illustrating a fifth implementation example of the present invention. In FIGS. 6A and 6B, an electrically probeable opens and shorts monitor 210 replaces a subset of damascene fill shapes 150 of FIGS. 1A and 1B. Opens and shorts monitor 210 includes a first damascene serpentine wire 215 and a second damascene serpentine wire 215 spaced a distance S7 apart. Opposite ends of damascene serpentine wire 215 are connected to different damascene fill shapes 150 to allow probing and opposite ends of damascene serpentine wire 215 are connected to different damascene fill shapes 150 to allow probing. In a first example, S7 is equal to or greater than the minimum ground rule value. In a second example, S7 is less than the minimum ground rule value. FIGS. 6A and 6B, illustrate that the monitor structure need not always approximate damascene fill shape geometries or be fabricated to fill shape rules.

Up to this point, only monitor structures requiring one level have been considered.

We will now turn to monitor structures that require two or more levels.

FIG. 7A is a top view and FIG. 7B is a cross-sectional view through line 7B-7B of FIG. 7A of a portion of an integrated circuit chip having damascene fill shapes illustrating a sixth implementation example of the present invention. In FIGS. 7A and 7B, an electrically probeable via chain monitor 225 replaces a subset of damascene fill shapes 150 of FIGS. 1A and 1B. A via chain monitor, allows analysis of the contact resistance between the via and the wires the via connects. In the example of FIGS. 7A and 7B, via chain monitor 225 comprises damascene fill shaped regions 150F each having a damascene via 230 and integrally connected in series by alternating first damascene wires 235 in dielectric layer 215 and second damascene wires 240 in first dielectric layer 105. In one example, damascene fill shape portions 150F are placed in the same locations and have the same dimensions as the damascene fill shapes that they replace and damascene wires 235 have the width W2. Thus, via chain monitor 225 has about the same shapes density as areas containing only damascene fill shapes, especially when damascene wires 235 are fabricated to minimum ground rules.

FIG. 8A is a top view and FIG. 8B is a cross-sectional view through line 8B-8B of FIG. 8A of a portion of an integrated circuit chip having damascene fill shapes illustrating a seventh implementation example of the present invention. In FIGS. 8A and 8B, a voltage contrast shorts monitor 245 replaces a subset of damascene fill shapes 150 of FIGS. 1A and 1B. Shorts monitor 245 is similar to shorts monitor 185 illustrated in FIGS. 4A and 4B and described supra, except for the provision to ground damascene central pad 190 to substrate 100 through damascene via 250, damascene pad 255, damascene stud 260 and diffusion contact 265. Opens monitor 195 illustrated in FIGS. 5A and 5B and described supra, may be similarly grounded.

The monitor structures presented supra, have all been defect monitors. It is also possible to insert parametric monitors and performance monitors into space otherwise filled with fill shapes as illustrated in FIGS. 9A and B and described infra.

FIG. 9A is a top view and FIG. 9B is a cross-sectional view through line 9B-9B of FIG. 9A of a portion of an integrated circuit chip having fill shapes illustrating an eighth second implementation example of the present invention. Complex monitor structures, including but not limited to resistance monitors, capacitance monitors, inductance monitors, gate oxide monitors, ring oscillator frequency monitors, FET current leakage monitors, FET switching speed monitors and more generally, monitors requiring active and passive devices wired into circuits may be implemented according to the present invention by utilizing regions of fill shapes located over regions of unused gate arrays. In FIGS. 9A and 9B, a gate array comprising NFETs 270A and PFETS 270B is formed in substrate 100 and first dielectric layer 105. Each NFET 270A includes a channel 275A and source/rains 280A all formed in substrate 100 and a gate electrode 290A over a gate dielectric (not shown) formed in first dielectric layer 105. Each PFET 270B includes a channel 275B and source/drains 280B all formed in a well 285 formed in substrate 100 and a gate electrode 290B over a gate dielectric (not shown) formed in first dielectric layer 105. The NFET and PFET regions are isolated by dielectric isolation 295. Circuit wiring (damascene wires, damascene vias, damascene contacts) is formed in first dielectric layer 105 and in second dielectric layer 115. The circuit wiring formed in second dielectric layer 115 replaces a subset of damascene fill shapes 150 of FIGS. 1A and 1B.

Figure 10:
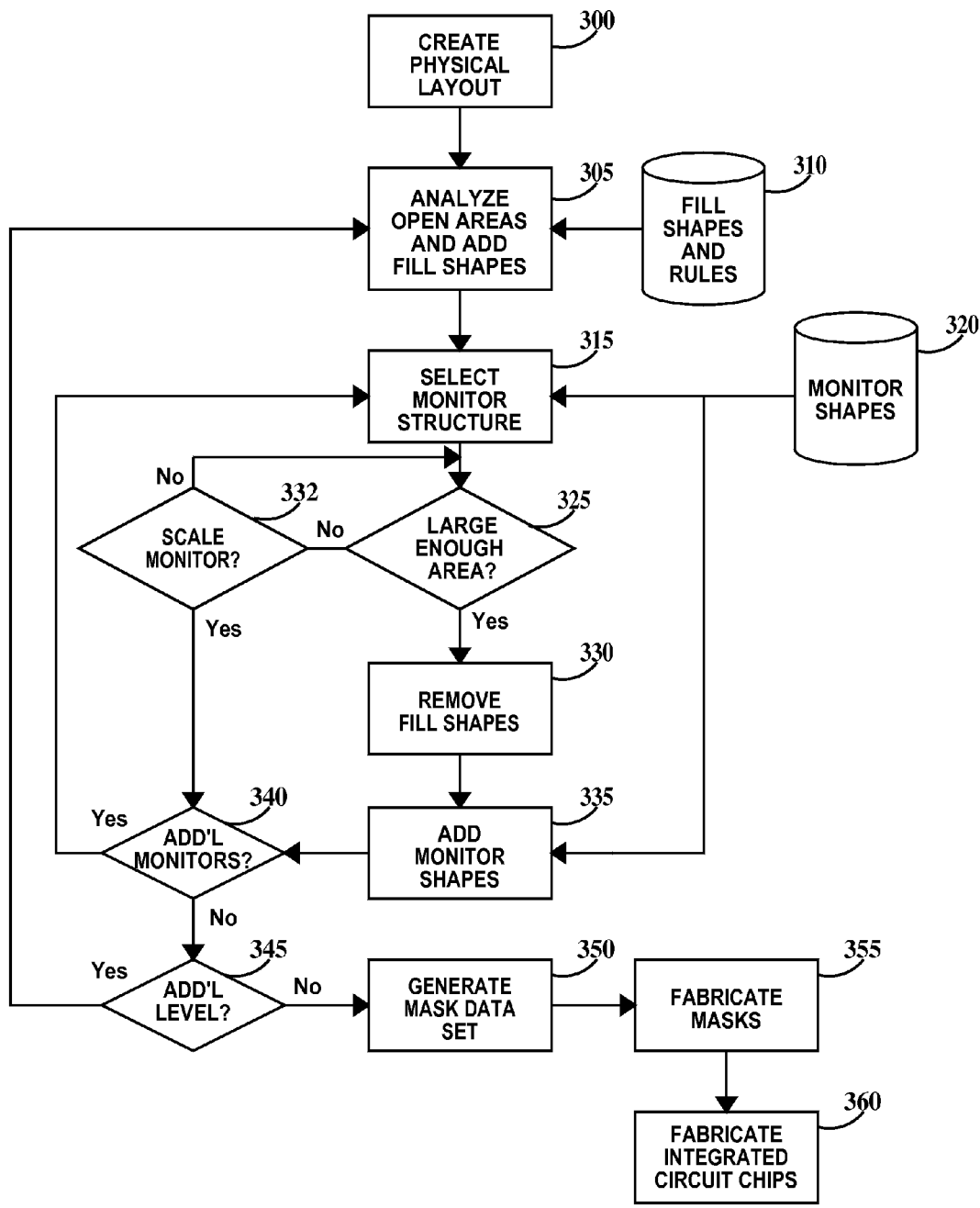
FIG. 10 is a flowchart of a first embodiment of the present invention.

FIG. 10 is a flowchart of a first embodiment of the present invention. In step 300. a physical layout file, called a shapes file is created, usually from a netlist. Shapes files are generated from netlist files, which are a schematic representation of the circuits of the integrated circuits. Shapes files are a representation of the geometric shapes required to fabricate each of the photomasks required to fabricate all the levels of the integrated circuit and contain integrated circuit element shapes.

In step 305, open areas of the first or current photomask level, are analyzed and fill shapes selected and placed in the open areas based between integrated circuit element shapes based on fill shape selection and placement rules in a fill shapes and rules file 310. Examples of fill shape rules include, but are not limited to: the geometry and dimensions of the fill shapes, the minimum and maximum distances fill shapes can be placed from integrated circuit shapes, the distances between fill shapes and the template pattern used to place the fill shapes. For monitor structures requiring more than one photomask level, a look-ahead may be performed to see if the required area in the proper position in the additional photomask levels exists as well.

In step 315, a monitor structure is selected from a monitor shapes file 320 based what type of monitor it is desired to add to the integrated circuit chip design. In step 325, it is determined if there is an area of fill shapes large enough to accommodate the selected monitor structure. If there is an area of fill shapes large enough to accommodate the selected monitor structure the method proceeds to step 330. If there are no areas large enough, the method will proceed to step 332. In step 332 it is determined if the monitor structure can scaled to a smaller size. If it can, the method loops back to step 325 otherwise the method goes to step 340.

In step 330, sufficient fill shapes are removed to accommodate the monitor shapes and in step 335, the monitor shapes are added. Next, in step 340, it is determined if additional monitors are to be placed in the current photomask level. If additional monitors are to be placed, the method loops back to step 315, otherwise the method proceeds to step 345. In step 345 it is determined if any monitors are to be placed in the next photomask level. Additionally, it is determined if any of the monitor structures placed in the current photomask level require placement of additional monitor structures in another photomask level to complete the monitor structure (i.e. multi-level monitor structures such as illustrated in FIGS. 8A, 8B, 9A and 9B and described supra). This can be done by attaching flags to multi-level monitor shapes. If additional monitor shapes are to be placed the method loops back to step 305, otherwise the method proceeds to step 350.

In step 350 additional processing of the shapes file to generate a mask data set, (for example a GL1 (graphics language 1) deck), to drive mask fabrication equipment or to drive direct wafer write equipment is performed. In direct write, the pattern is transferred directly to a photoresist or other layer on the wafer without the use of a photomask by a tool that reads the mask data set directly. A direct write E-beam tool is an example of such a tool. Steps 300 through 350 are usually performed with a general purpose computer. Then in step 355 masks are fabricated and in step 360 the integrated circuit is fabricated. Step 355 is eliminated in direct write fabrication processes.

Figure 11:
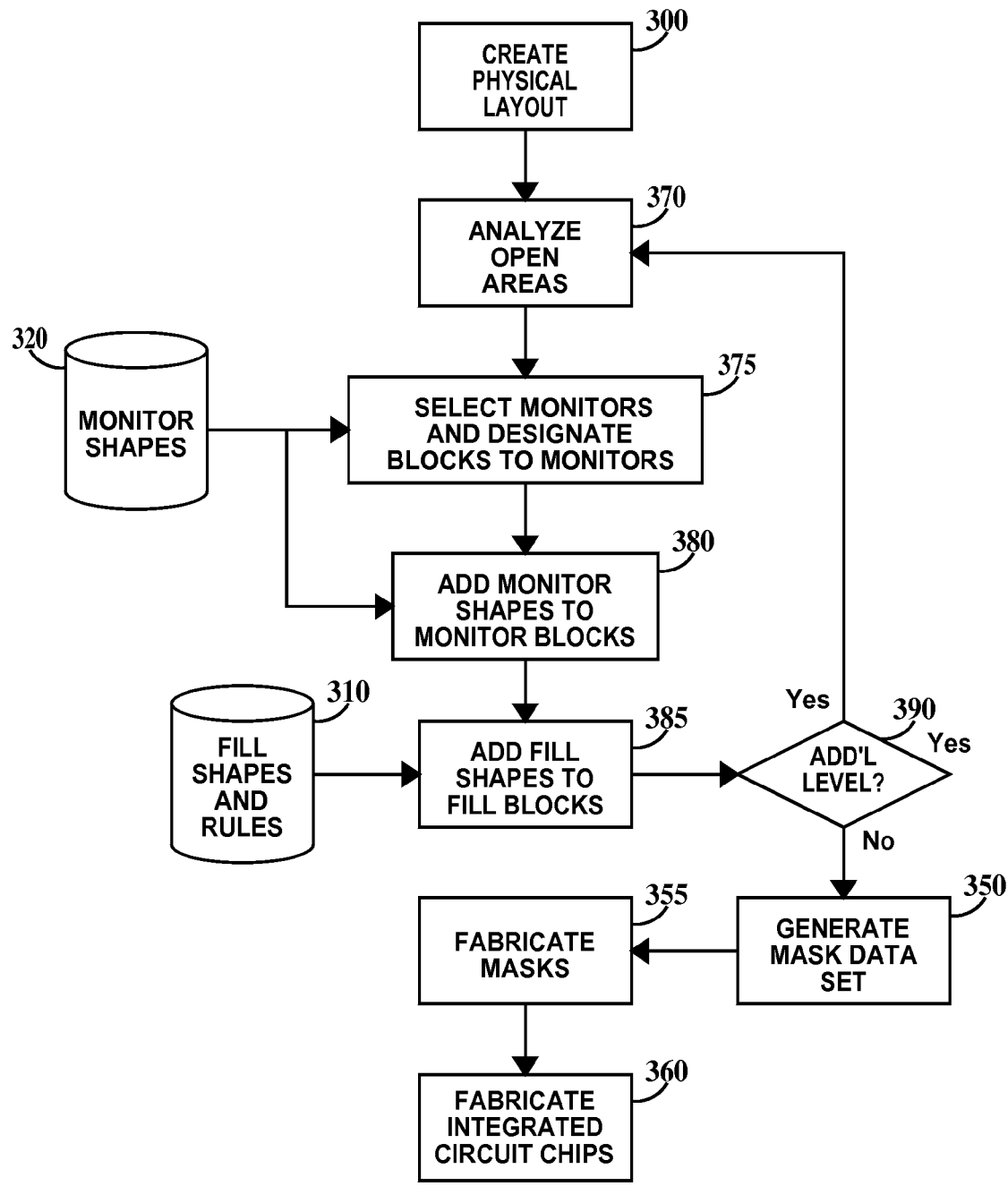
FIG. 11 is a flowchart of a second embodiment of the present invention.

FIG. 11 is a flowchart of a second embodiment of the present invention. Step 300 has been described supra in reference to FIG. 10. In step 370, areas between integrated circuit element shapes of the first or current photomask level, are analyzed. In step 375, the monitors to be inserted into the integrated circuit design are selected and blocks of open area are designated for placement of the shapes for each monitor structure based on the area requirement of each monitors' shape files listed in monitor shapes file 320. For monitor structures requiring more than one photomask level, a look-ahead may be performed to see if the required area in the proper position in the additional photomask levels exists as well. In step 380, the selected monitor fill shapes are placed in the blocks of area assigned to monitors. In step 385, fill shapes are placed based on the fill shape rules from fill shapes and rules file 310.

Next, in step 395, it is determined if any monitors are to be placed in the next photomask level. Additionally, it is determined if any of the monitor structures placed in the current photomask level require placement of additional monitor structures in another photomask level to complete the monitor structure (i.e. multi-level monitor structures such as illustrated in FIGS. 8A, 8B, 9A and 9B and described supra). This can be done by attaching flags to multi-level monitor shapes. If additional monitor shapes are to be placed the method loops back to step 370, otherwise the method proceeds to step 350. Steps 350, 355 and 360 have been described supra in reference to FIG. 10.

Figure 12:
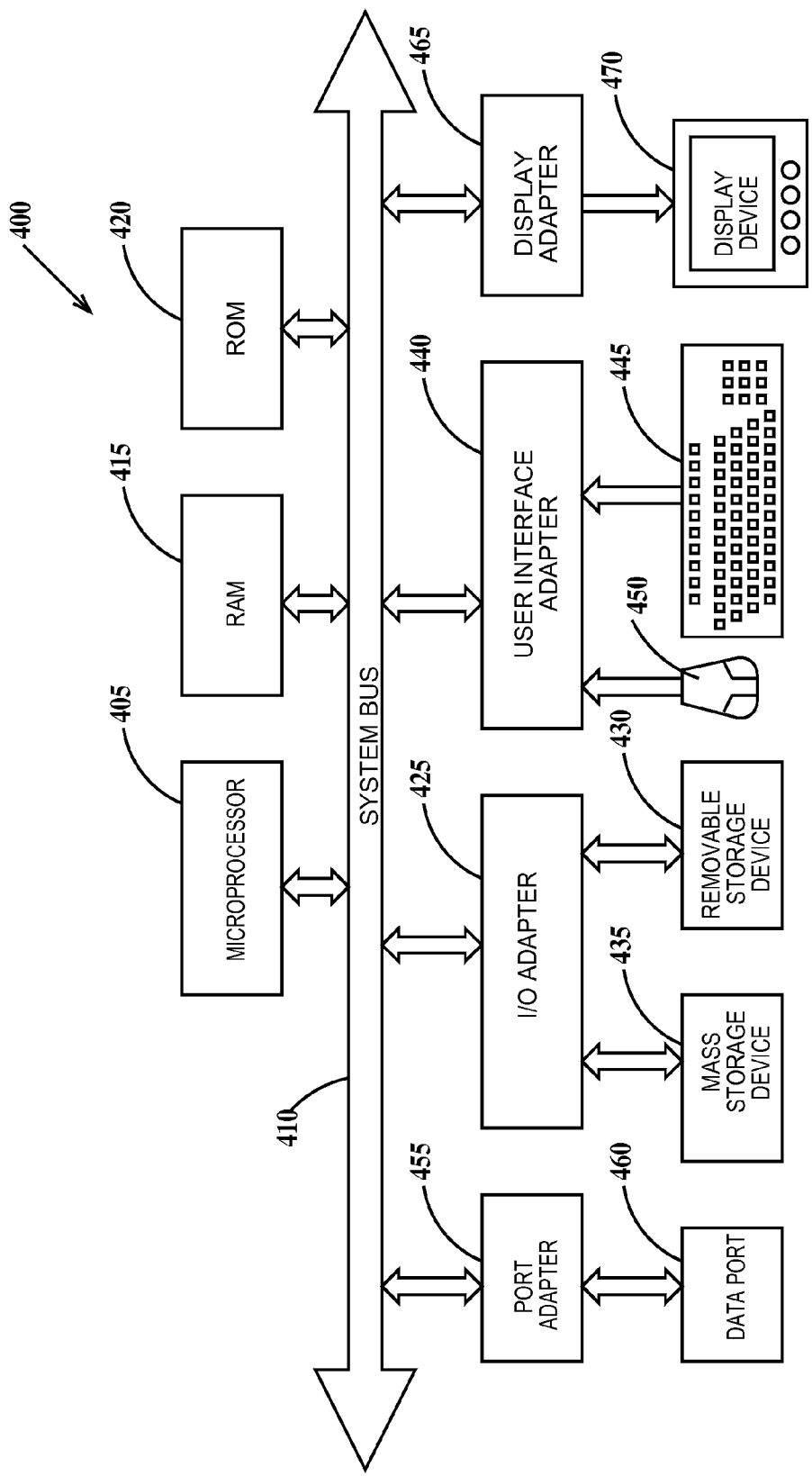
FIG. 12 is a schematic block diagram of a general-purpose computer for practicing the present invention.

FIG. 12 is a schematic block diagram of a general-purpose computer for practicing the present invention. Generally, the method described herein with respect to adding fabrication monitors to an integrated circuit chip design is practiced with a general-purpose computer and the method may be coded as a set of instructions on removable or hard media for use by the general-purpose computer. FIG. 12 is a schematic block diagram of a general-purpose computer for practicing the present invention. In FIG. 12, computer system 400 has at least one microprocessor or central processing unit (CPU) 405. CPU 405 is interconnected via a system bus 410 to a random access memory (RAM) 415, a read-only memory (ROM) 420, an input/output (I/O) adapter 425 for a connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470.

ROM 420 contains the basic operating system for computer system 400. The operating system may alternatively reside in RAM 415 or elsewhere as is known in the art. Examples of removable data and/or program storage device 430 include magnetic media such as floppy drives and tape drives and optical media such as CD ROM drives. Examples of mass data and/or program storage device 435 include hard disk drives and non-volatile memory such as flash memory. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 430, fed through data port 460 or typed in using keyboard 445.

Thus, the present invention allows for placing more monitor structures on integrated circuits than is currently possible using only scribe line area.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An integrated circuit chip, comprising:
a dielectric layer on a substrate, said dielectric layer having a circuit region containing integrated circuits required for operation of said integrated circuit chip and a surrounding scribe line region not containing integrated circuits required for operation of said integrated circuit chip;
a multiplicity of wires of an integrated circuit, said wires formed in said circuit region of said dielectric layer; and
a monitor structure and a multiplicity of fill shapes in regions of said dielectric layer between said wires, said monitor structure and said fill shapes not required for the operation of said integrated circuit, said monitor structure not connected to said wires, said fill shapes not connected to said wires and said monitor structure not connected to said fill shapes.

2. The integrated circuit chip of claim 1, wherein said monitor structure includes one or more regions having the same shape as a shape of one of said fill shapes.

3. The integrated circuit chip of claim 1, wherein a ratio of a surface area of said monitor structure to a surface area of said dielectric layer in a first region of said dielectric layer containing only said monitor structure is about equal to a ratio of a surface area of said fill shapes to a surface area of said dielectric layer in a second region of said dielectric layer containing only said fill shapes, a surface area of said first region about equal to a surface area of said second region.

4. The integrated circuit chip of claim 1, wherein said wires are damascene wires, said monitor structure is a damascene monitor structure and said fill shapes are damascene fill shapes.

5. The integrated circuit chip of claim 1, wherein said wires are subtractive wires, said monitor structure is a subtractive monitor structure and said fill shapes are subtractive fill shapes.

6. The integrated circuit chip of claim 1, wherein top surfaces of said wires, said monitor structure, said fill shapes and said dielectric layer are coplanar.

7. The integrated circuit chip of claim 1, wherein, said fill shapes adjacent to said monitor structure have identical shapes and said monitor structure includes one or more regions having the same shape as said adjacent fill shapes.

8. The integrated circuit chip of claim 1, wherein, said fill shapes adjacent to said monitor structure are arranged in a first region of a pattern and said monitor structure includes one or more regions having the same shape as said adjacent fill shapes and positioned in a second region of said pattern.

9. The integrated circuit chip of claim 1, wherein said fill shapes are not connected to each other.

10. The integrated circuit chip of claim 1, wherein said fill shapes are not connected to additional fill shapes in additional dielectric layers of said integrated circuit chip.

11. The integrated circuit chip of claim 1, wherein said fill shapes are formed only in said dielectric layer.

12. The integrated circuit chip of claim 1, wherein said monitor structure is formed only in said dielectric layer.

13. The integrated circuit chip of claim 1, wherein a first portion of said monitor structure is formed only in said dielectric layer and a second portion of said monitor structure is formed only in an additional dielectric layer, said additional dielectric layer contacting a top or bottom surface of said dielectric layer.

14. The integrated circuit chip of claim 1, wherein said monitor structure is contained in said dielectric layer and comprises a set of pads serially interconnected by additional wires, said pads having the same shape and size as said fill shapes.

15. The integrated circuit chip of claim 1, wherein:
said monitor structure comprises an elongated pad contained in said dielectric layer and spaced a first distance from adjacent fill shapes contained in said dielectric layer; and
said fill shapes are spaced a second distance apart, said first distance less than said second distance.

16. The integrated circuit chip of claim 1, wherein said monitor structure comprises an elongated pad contained in said dielectric layer, said monitor structure surrounded by a set of pads contained in said dielectric layer, said pads connected to said elongated pad by corresponding additional wires contained in said dielectric layer, said pads having the same size and shape as said fill shapes.

17. The integrated circuit chip of claim 1, wherein said monitor structure comprises:
a set of pads, said pads having the same shape and size as said fill shapes and spaced apart a same distance as said fill shapes, said pads connected in pairs by additional wires in said dielectric layer; and
a set of vias in said dielectric layer connecting said pads to lower wires in a lower dielectric layer under said dielectric layer, said lower wires serially connecting said pairs of pads.

* * * * *